US010886904B1

(12) United States Patent
Zhou et al.

(10) Patent No.: US 10,886,904 B1
(45) Date of Patent: Jan. 5, 2021

(54) AREA-EFFICIENT NON-OVERLAPPING SIGNAL GENERATOR

(71) Applicant: QUALCOMM Incorporated, San Diego, CA (US)

(72) Inventors: Qubo Zhou, San Diego, CA (US); Yan Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/752,412

(22) Filed: Jan. 24, 2020

(51) Int. Cl.
*H03K 5/134* (2014.01)
*H03K 19/003* (2006.01)
*H03K 19/0185* (2006.01)

(52) U.S. Cl.
CPC ....... *H03K 5/134* (2014.07); *H03K 19/00384* (2013.01); *H03K 19/018557* (2013.01)

(58) Field of Classification Search
CPC ............. H03K 5/134; H03K 19/00384; H03K 19/018557
USPC ......................................... 327/108, 109, 281
See application file for complete search history.

(56) References Cited

U.S. PATENT DOCUMENTS

| 5,754,065 A * | 5/1998 | Wong ..................... H02M 7/538 327/108 |
| 2010/0188150 A1* | 7/2010 | Zhu .......................... H03F 3/217 330/251 |
| 2011/0298527 A1* | 12/2011 | Lloyd .................... H03K 17/18 327/478 |
| 2018/0331682 A1* | 11/2018 | Duduman ............... H02M 1/38 |

\* cited by examiner

*Primary Examiner* — William Hernandez
(74) *Attorney, Agent, or Firm* — Patterson+ Sheridan, L.L.P.

(57) ABSTRACT

Certain aspects of the present disclosure generally relate to a power stage. The power stage generally includes a first transistor, a second transistor having a drain coupled to a drain of the first transistor, a first gate drive circuit coupled between an input node of the power stage and a gate of the first transistor, and a second gate drive circuit having a first signal path coupled between the input node and a gate of the second transistor. In certain aspects, the second gate drive circuit comprises a plurality of buffers in the first signal path, and a plurality of electronic devices coupled to the plurality of buffers and configured to apply a delay associated with driving the gate of the second transistor to track a delay associated with driving the gate of the first transistor via the first gate drive circuit.

20 Claims, 2 Drawing Sheets

AREA-EFFICIENT NON-OVERLAPPING SIGNAL GENERATOR

TECHNICAL FIELD

Certain aspects of the present disclosure generally relate to electronic circuits and, more particularly, to gate drive circuitry for a power stage.

BACKGROUND

As the minimum feature size of integrated circuits (ICs) continues to shrink and the desire for reduced power consumption persists, the core logic section of digital circuits is being supplied from ever-decreasing voltages, such as down to 1.0 V or lower. However, the power supply voltages of other sections of the IC may remain at higher voltage levels. Therefore, a voltage level shifter (e.g., level-shifting circuit) may be used to level-shift a signal from a relatively low supply voltage to a relatively high supply voltage.

SUMMARY

Certain aspects of the present disclosure generally relate to a power stage. The power stage generally includes: a first transistor; a second transistor having a drain coupled to a drain of the first transistor; a first gate drive circuit coupled between an input node of the power stage and a gate of the first transistor; and a second gate drive circuit having a first signal path coupled between the input node and a gate of the second transistor, wherein the second gate drive circuit comprises: a plurality of buffers in the first signal path; and a plurality of electronic devices coupled to the plurality of buffers and configured to apply a delay associated with driving the gate of the second transistor to track a delay associated with driving the gate of the first transistor via the first gate drive circuit.

Certain aspects of the present disclosure generally relate to a method for signal processing. The method generally includes: driving, via a first gate drive circuit, a gate of a first transistor based on an input signal; driving, via a second gate drive circuit, a gate of a second transistor based on the input signal; and applying a delay associated with driving the gate of the second transistor via a plurality of electronic devices coupled to a plurality of a buffers in a first signal path of the second gate drive circuit, wherein the delay tracks a delay associated with driving the gate of the first transistor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

An Example Non-Overlapping Signal Generator

An H-bridge circuit (e.g., a half H bridge implemented with two switches, or an H bridge implemented with four switches) in a power stage may operate under a high voltage (HV) supply (e.g., 12 V and above). The H-bridge circuit may include a p-type metal-oxide-semiconductor (PMOS) transistor having a drain coupled to a drain of an n-type metal-oxide-semiconductor (NMOS) transistor. The PMOS drive voltage (PDRV) may toggle between a supply voltage (e.g., a high voltage rail (VDD_HV)) and supply-delta voltage, the delta voltage being any voltage greater than a threshold voltage of the PMOS transistor of the power stage.

A level shifter may be used to level shift a ground-referred signal to the PDRV to control the high-side PMOS transistor of the H-bridge circuit. To implement a break-before-make (BBM) operation, the low-side control voltage (e.g., generated via an NMOS drive voltage (NDRV) circuit) may be generated using the same type of high voltage level shifter having about the same amount of delay as the PDRV circuit. The high voltage level shifters consume large area due to high voltage protection devices included therein. Certain aspects of the present disclosure are directed to an NDRV circuit implemented with an area-efficient BBM generator that tracks the PDRV circuit delay over process, voltage, and temperature (PVT) variations.

Figure 1:
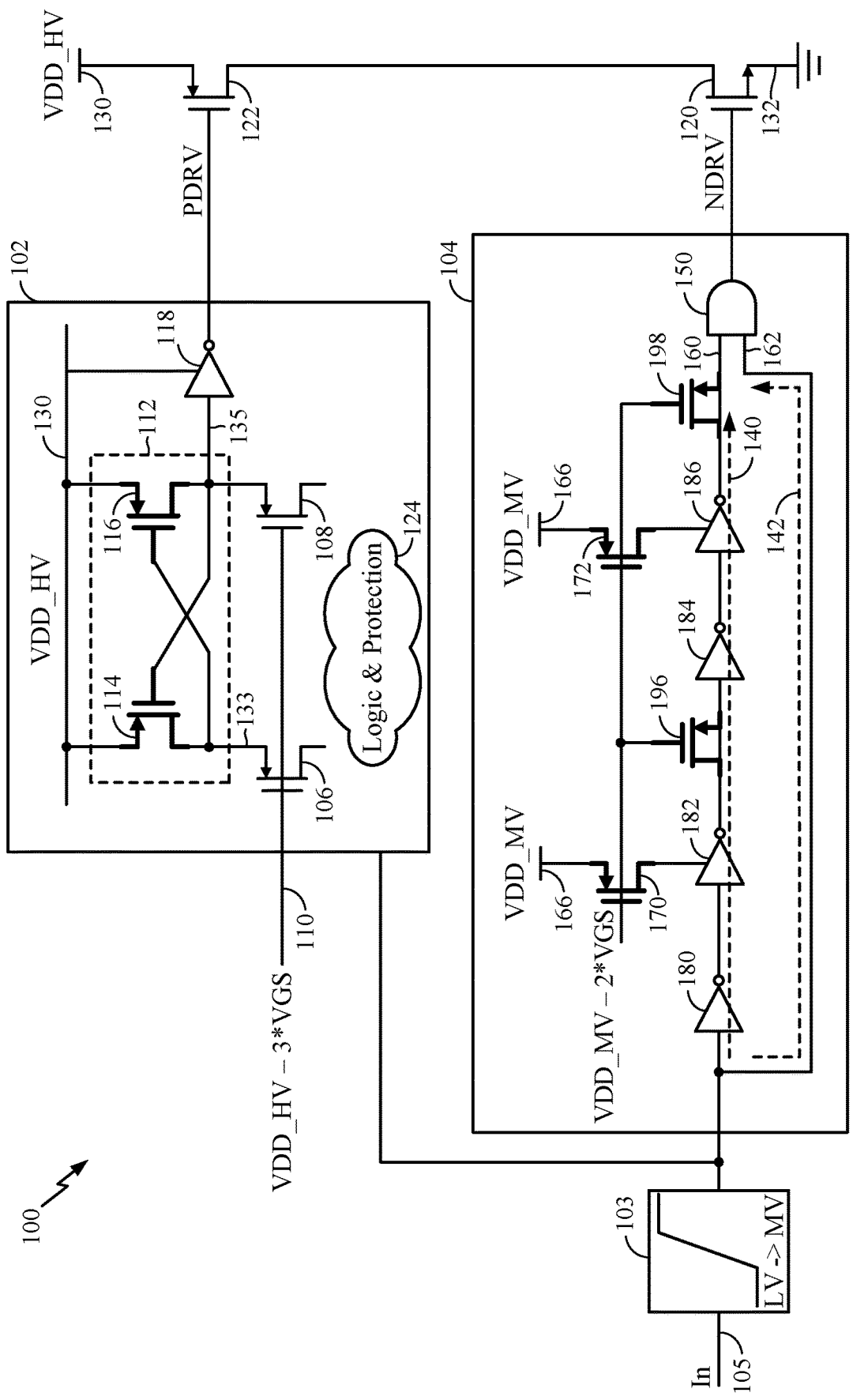
FIG. 1 illustrates a half H-bridge circuit having a p-type metal-oxide-semiconductor (PMOS) drive circuit and an n-type metal-oxide-semiconductor (NMOS) drive circuit, in accordance with certain aspects of the present disclosure.

FIG. 1 illustrates a half H-bridge circuit 100 having a PDRV circuit 102 and an NDRV circuit 104 (also referred to as a "non-overlapping signal generator" or "BBM generator"), in accordance with certain aspects of the present disclosure. The input signal, at the input node 105, may transition from a low voltage (LV) to a medium voltage (MV), as illustrated by block 103. The half H-bridge circuit 100 includes at least a PMOS transistor 122 and an NMOS transistor 120 coupled between a high voltage (HV) supply node 130 (VDD_HV) and a reference potential node 132

(e.g., electric ground). As illustrated, the drains of the PMOS transistor 122 and the NMOS transistor 120 may be coupled together.

The PDRV circuit 102 includes transistors 106, 108 having gates coupled to a gate drive node 110. The transistors 106, 108 are coupled to a latch circuit 112. The delay associated with the PDRV circuit 102 may be dominated by the latch properties of the latch circuit 112. The latch circuit 112 includes cross-coupled transistors 114, 116. In other words, the gate of the transistor 114 is coupled to a drain of the transistor 116, and the gate of the transistor 116 is coupled to a drain of the transistor 114, as illustrated. The sources of the transistors 114, 116 are coupled to the high voltage supply node 130 (VDD_HV). In certain aspects, the gate drive node 110 may receive a voltage that is equal to VDD_HV−3VGS, where VGS is the gate-to-source voltage of the transistor 114 or transistor 116. A buffer 118 (e.g., inverter) may be coupled between the gate of the PMOS transistor 122 and the drain of the transistor 116. For example, an input of the buffer 118 may be coupled to the drain of the transistor 116 while an output of the buffer 118 may be coupled to the gate of the PMOS transistor 122. In certain aspects, the PDRV circuit 102 may also include logic and protection circuitry 124, as illustrated.

The NDRV circuit 104 includes various delay elements to implement a BBM generator for driving the NMOS transistor 120 in a fashion that prevents the PMOS transistor 122 and the NMOS transistor 120 from both being turned on at the same time. In other words, the NDRV circuit 104 may ensure that the gate voltage of the NMOS transistor 120 goes from logic low to logic high, turning on the NMOS transistor 120, only after the PMOS transistor has turned off. Furthermore, the NDRV circuit 104 may ensure that the gate voltage of the NMOS transistor 120 goes from logic high to logic low, turning off the NMOS transistor 120, before the PMOS transistor is turned on.

The NDRV circuit 104 includes a slow path 140 and a fast path 142, coupled between the input node 105 and inputs 160, 162 of an AND gate 150. In this manner, a delay is only applied for the slow path 140 and not the fast path 142. In other words, the output of the AND gate 150 only transitions to logic high, closing the NMOS transistor 120, when both of the inputs of the AND gate 150 are logic high. Therefore, when the input to the NDRV circuit 104 transitions from logic low to logic high to close the NMOS transistor 120, the delay associated with the slow path 140 results in a delay of the transition from logic low to logic high at the input of the AND gate 150, and thus, a delay in turning on the NMOS transistor 120. Accordingly, the delay prevents the NMOS transistor 120 from turning on until the PMOS transistor has had a chance to turn off. However, when the input to the NDRV circuit 104 transitions from logic high to logic low to turn off the NMOS transistor 120, the delay associated with the slow path 140 is not determinative of the time at which the output of the AND gate transitions from logic high to low. In other words, the fast path 142 sets the input 162 of the AND gate to logic low with little to no delay, resulting in the output of the AND gate transitioning to logic low, regardless of the logic state at the input 160.

In certain aspects, certain delay elements of the slow path may be configured to track (or at least be close to) delays associated with the PDRV circuit 102. For example, the slow path may include multiple buffers 180, 182, 184, 186 (e.g., inverters). Transistors 170, 172 may be coupled between a medium voltage supply node 166 (VDD_MV) and respective supply inputs of buffers 182, 186. Moreover, a capacitive element 196 may be coupled between the gates of the transistors 170, 172 and the output of the buffer 182, and a capacitive element 198 may be coupled between the gates of the transistors 170, 172 and the output of the buffer 186. Each of the capacitive elements 196, 198 may be implemented using a transistor (e.g., PMOS transistor) having its drain and source terminals coupled together, as illustrated.

In certain aspects, the transistors 170, 172 may be replicas of the transistors 106, 108. Moreover, the gate-to-source voltage applied to each of the transistors 170, 172 may be equal to the gate-to-source voltage applied to each of the transistors 106, 108. For example, the gate-to-source voltage applied to the transistor 170 may be equal to (VDD_MV−2×VGS)−VDD_MV, which is equal to 2×VGS. The voltage applied to the gate of the transistor 106 may be equal to VDD_HV−3×VGS. Moreover, the voltage at the node 133 may be at VDD_HV−VGS. Therefore, the gate-to-source voltage of the transistor 106 may be equal to (VDD_HV−3×VGS)−(VDD_HV−VGS), which is equal to 2×VGS. Therefore, gate-to-source voltages of the transistors 170, 106 may be the same, resulting in the source-to-drain impedance of the transistors 106, 170 being at least close to the same.

Moreover, the capacitive elements 196, 198 may be configured to be the same as the junction capacitance associated with the transistors 114, 116. For example, to transition the voltage at node 135 from logic high to logic low to turn off the PMOS transistor 122, the transistor 116 may be turned off by charging the junction capacitance of the transistor 116. In other words, the delay associated with the transition from logic high to logic low at node 135 may be a function of the resistance-capacitance (RC) time constant associated with the source-to-drain impedance of the transistor 106 and the junction capacitance associated with the transistor 116. This RC time constant may be tracked by the RC time constant associated with the source-to-drain impedance of the transistor 170 and the capacitance of the capacitive element 196 in order for the delay associated with the slow path 140 to track the delay associated with the PDRV circuit 102.

The variation in the drain-to-source impedances of the transistors 170, 172 may track the variations in the impedances of the transistors 106, 108 across PVT. Moreover, the variations in the capacitances of the capacitive elements 196, 198 may track the variations in the junction capacitances of the transistors 106, 108. Therefore, the NDRV circuit 104 may implement a BBM functionality across PVT. In other words, the delay associated with the slow path 140 is achieved by PVT-tracking circuitry (e.g., transistors 170, 172, and capacitive elements 196, 198) that tracks the delay associated with the PDRV circuit 102.

While the example half H-bridge circuit 100 is implemented with a BBM generator for the NDRV circuit 104 to drive the NMOS transistor 120, a PDRV circuit for driving the PMOS transistor 122 may be implemented with a BBM generator instead in certain implementations. In other words, the PDRV circuit for driving the PMOS transistor 122 may be implemented with a BBM generator configured to track a delay associated with an NDRV circuit for driving the NMOS transistor 120. Moreover, while the slow path of the NDRV circuit 104 is implemented using four buffers to facilitate understanding, any number of buffers and associated RC time constant circuitry (e.g., transistor 170 and capacitive element 196) may be used. For example, the slow path may be implemented with six buffers that track the delay associated with the PDRV circuit 102, yet implements a greater delay for the BBM functionality as compared to using four buffers.

Figure 2:
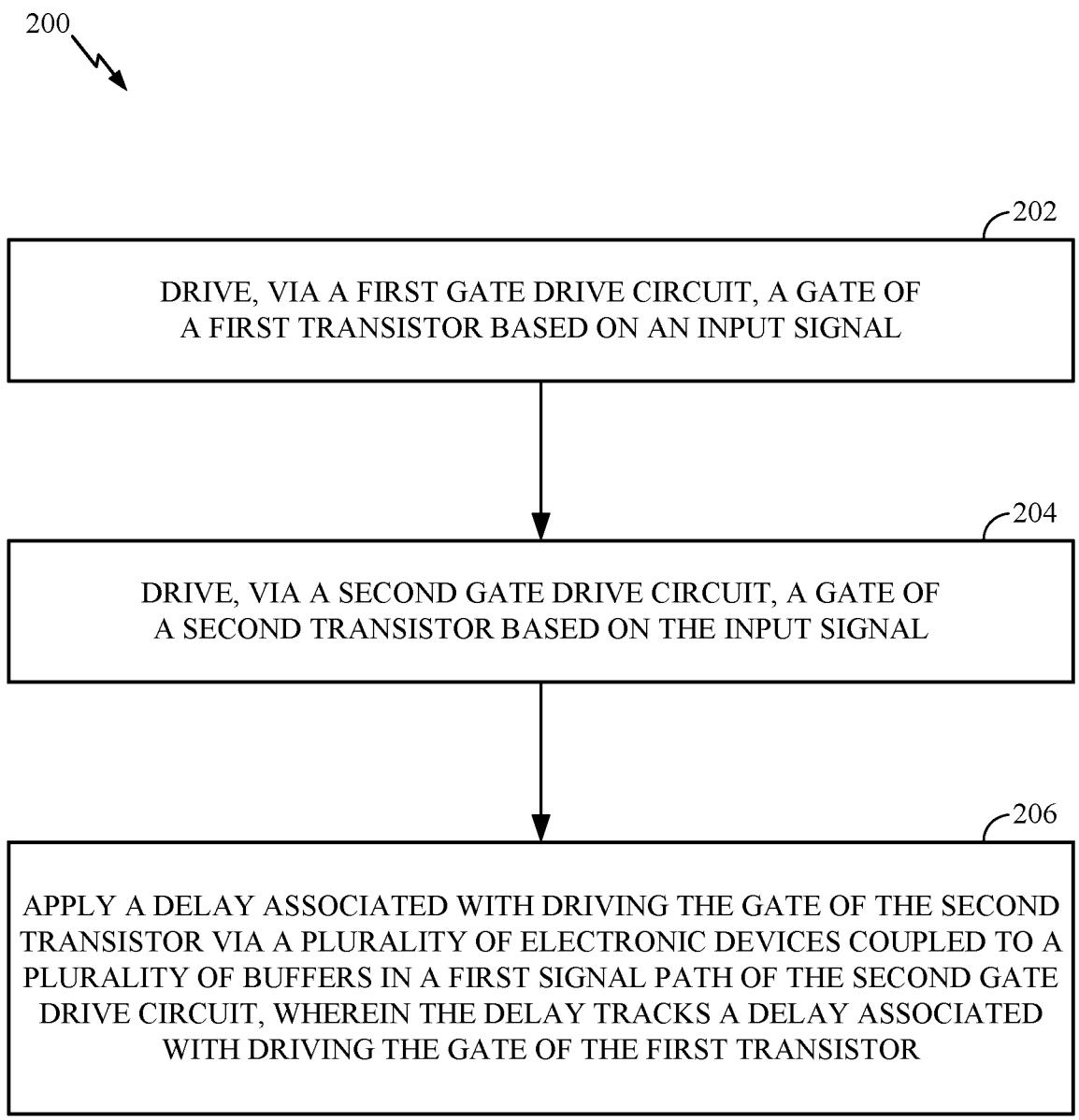
FIG. 2 is a flow diagram of example operations for signal processing, in accordance with certain aspects of the present disclosure.

FIG. 2 is a flow diagram of example operations 200 for signal processing, in accordance with certain aspects of the present disclosure. The operations 200 may be performed by a power stage circuit, such as the half H-bridge circuit 100.

The operations 200 begin, at block 202, with the circuit driving, via a first gate drive circuit (e.g., PDRV circuit 102), a gate of a first transistor (e.g., PMOS transistor 122) based on an input signal (e.g., at input node 105), and at block 204, driving, via a second gate drive circuit (e.g., NDRV circuit 104), a gate of a second transistor (e.g., NMOS transistor 120) based on the input signal. At block 206, the circuit applies a delay associated with driving the gate of the second transistor via a plurality of electronic devices coupled to a plurality of a buffers (e.g., buffers 180, 182, 184, 186) in a first signal path (e.g., slow path 140) of the second gate drive circuit. In certain aspects, the delay tracks a delay associated with driving the gate of the first transistor.

In certain aspects, the delay is applied only to a transition from logic low to logic high at the gate of the second transistor. In certain aspects, the plurality of electronic devices comprises replicas of electronic devices of the first gate drive circuit. In certain aspects, the plurality of electronic devices may include a third transistor (e.g., transistor 170) coupled between a voltage rail (e.g., voltage supply node 166) and a supply node of a buffer (e.g., buffer 182) of the plurality of buffers, and a first capacitive element (e.g., capacitive element 196) coupled to an output of the buffer of the plurality of buffers. The first capacitive element may be configured to replicate a capacitive element associated with the first gate drive circuit.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A power stage, comprising:
   a first transistor;
   a second transistor having a drain coupled to a drain of the first transistor;
   a first gate drive circuit coupled between an input node of the power stage and a gate of the first transistor; and
   a second gate drive circuit having a first signal path coupled between the input node and a gate of the second transistor, wherein the second gate drive circuit comprises:
      a plurality of buffers in the first signal path; and
      a plurality of electronic devices coupled to the plurality of buffers and configured to apply a delay associated with driving the gate of the second transistor to track a delay associated with driving the gate of the first transistor via the first gate drive circuit.

2. The power stage of claim 1, wherein the plurality of electronic devices comprises replicas of electronic devices of the first gate drive circuit.

3. The power stage of claim 1, wherein the plurality of electronic devices comprises:
   a third transistor coupled between a first voltage rail and a supply node of a first buffer of the plurality of buffers; and
   a first capacitive element coupled to an output of the first buffer.

4. The power stage of claim 3, wherein the first voltage rail is at a lower voltage than a second voltage rail of the first gate drive circuit.

5. The power stage of claim 3, wherein the first capacitive element is coupled between the output of the first buffer and a gate of the third transistor.

6. The power stage of claim 3, wherein the first capacitive element comprises a fourth transistor, wherein a drain of the fourth transistor is coupled to a source of the fourth transistor and to the output of the first buffer.

7. The power stage of claim 3, wherein the first gate drive circuit comprises:
   a latch circuit coupled to the gate of the first transistor; and
   a fourth transistor coupled to the latch circuit, wherein the third transistor is a replica of the fourth transistor.

8. The power stage of claim 7, wherein a gate-to-source voltage of the third transistor is the same as a gate-to-source voltage of the fourth transistor.

9. The power stage of claim 3, wherein the first capacitive element is configured to replicate a capacitive element associated with the first gate drive circuit.

10. The power stage of claim 9, wherein the first gate drive circuit comprises:
    a fourth transistor coupled to the gate of the first transistor, the capacitive element associated with the first gate drive circuit comprising a junction capacitance of the fourth transistor.

11. The power stage of claim 10, wherein the first gate drive circuit comprises a latch circuit having the fourth transistor and a fifth transistor, wherein a gate of the fourth transistor is coupled to a drain of the fifth transistor, and wherein a gate of the fifth transistor is coupled to a drain of the fourth transistor.

12. The power stage of claim 3, wherein the plurality of electronic devices comprises:

a fourth transistor coupled between the first voltage rail and a supply node of a second buffer of the plurality of buffers; and a second capacitive element coupled to an output of the second buffer.

13. The power stage of claim 1, wherein the second gate drive circuit comprises:

a second signal path; and an AND gate, wherein a first input of the AND gate is coupled to the first signal path, wherein a second input of the AND gate is shorted to the input node via the second signal path, and wherein an output of the AND gate is coupled to the gate of the second transistor.

14. The power stage of claim 1, wherein the plurality of buffers comprises a plurality of inverters.

15. The power stage of claim 1, wherein the delay is configured to be applied only to a transition from logic low to logic high at the gate of the second transistor.

16. A method for signal processing, comprising:

driving, via a first gate drive circuit, a gate of a first transistor based on an input signal;

driving, via a second gate drive circuit, a gate of a second transistor based on the input signal; and applying a delay associated with driving the gate of the second transistor via a plurality of electronic devices coupled to a plurality of buffers in a first signal path of the second gate drive circuit, wherein the delay tracks a delay associated with driving the gate of the first transistor.

17. The method of claim 16, wherein the delay is applied only to a transition from logic low to logic high at the gate of the second transistor.

18. The method of claim 16, wherein the plurality of electronic devices are replicas of electronic devices of the first gate drive circuit.

19. The method of claim 16, wherein the plurality of electronic devices comprises:

a third transistor coupled between a voltage rail and a supply node of a buffer of the plurality of buffers; and a capacitive element coupled to an output of the buffer of the plurality of buffers.

20. The method of claim 19, wherein the capacitive element is configured to replicate a capacitive element associated with the first gate drive circuit.

* * * * *